US006763484B2

(12) United States Patent
Tschanz et al.

(10) Patent No.: US 6,763,484 B2
(45) Date of Patent: Jul. 13, 2004

(54) BODY BIAS USING SCAN CHAINS

(75) Inventors: James W. Tschanz, Hillsboro, OR (US); Siva G. Narendra, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 568 days.

(21) Appl. No.: 09/894,465

(22) Filed: Jun. 28, 2001

(65) Prior Publication Data

US 2003/0005378 A1 Jan. 2, 2003

(51) Int. Cl.[7] .......................... G01R 31/28; G05F 1/618

(52) U.S. Cl. ...................................... 714/726; 323/283

(58) Field of Search ................................. 714/724, 726; 324/500, 522, 523, 76.39, 76.41; 323/281, 283, 284

(56) References Cited

U.S. PATENT DOCUMENTS

| 6,118,390 | A | * | 9/2000 | Chen et al. .................... 341/53 |
| 6,166,584 | A |   | 12/2000 | De .............................. 327/534 |
| 6,177,785 | B1 | * | 1/2001 | Lee ............................. 323/281 |
| 6,218,892 | B1 |   | 4/2001 | Soumyanath et al. ....... 327/537 |
| 6,218,895 | B1 |   | 4/2001 | De et al. ..................... 327/566 |
| 6,538,486 | B1 | * | 3/2003 | Chen et al. ................. 327/202 |
| 6,587,296 | B1 | * | 7/2003 | Iroaga et al. ................. 360/63 |

* cited by examiner

Primary Examiner—Christine T. Tu
(74) Attorney, Agent, or Firm—Schwegman, Lundberg, Woessner & Kluth, P.A.

(57) ABSTRACT

A logic unit and method incorporating body biasing using scan chains, the logic unit comprising a functional unit block including a body and a scan chain, and a variable voltage source coupled to the scan chain to receive control signals from the scan chain and coupled to the body to provide a bias voltage to the body, and the method comprising identifying a preferred body bias voltage for a functional unit block having a body; and permanently programming a plurality of control signals coupled to a variable voltage source that provides the preferred body bias voltage to the body.

26 Claims, 6 Drawing Sheets

BODY BIAS USING SCAN CHAINS

FIELD

The present invention relates to integrated circuits and, more particularly, to biasing the body of a functional unit block in an integrated circuit.

BACKGROUND

An integrated circuit, such as a processor, includes a large number of transistors, and many of the transistors are intended to have identical operating parameters. For example, the input transistors of the logic gates in a processor are intended to have identical threshold voltages and leakage currents. Unfortunately, manufacturing process variations, such as random dopant fluctuations, over the area of a die on which an integrated circuit is fabricated, can cause transistors fabricated in different areas of the die to have different threshold voltages and leakage currents. Transistors that have different threshold voltages have different maximum operating frequencies, and transistors that have different leakage currents consume different amounts of power.

This transistor-to-transistor variation causes several inefficiencies during the operation of an integrated circuit. First, some transistors in the integrated circuit have a lower than intended threshold voltage. When operated at the integrated circuit's target operating frequency, these transistors have a larger leakage current than the transistors that have the intended threshold voltage. The larger leakage current causes the integrated circuit to consume more power than necessary. Second, some transistors in the integrated circuit have a higher than intended threshold voltage. These transistors have a maximum operating frequency that is less than the integrated circuit's target operating frequency, which prevents the integrated circuit from operating at its target operating frequency.

Transistor operating frequencies can be made more uniform and leakage currents can be reduced in an integrated circuit by applying a bias voltage to the body of each transistor or group of transistors in the integrated circuit. The bias voltage can be chosen to increase the threshold voltage of each transistor, which decreases the maximum operating frequency of each transistor and decreases the leakage current in each transistor, or the bias voltage can be chosen to decrease the threshold voltage of each transistor, which increases the maximum operating frequency of each transistor. To identify the proper bias voltage for a particular group of transistors in an integrated circuit, a separate test path that duplicates the critical path (the path that must operate the fastest) for a particular group of transistors is fabricated on the die. A bias voltage is identified that causes the test path to operate correctly at the integrated circuit's target operating frequency. The identified bias voltage is then applied to all transistors in the selected group of transistors to reduce leakage current power consumption in the selected group of transistors and to prepare the selected group of transistors to operate at the integrated circuit's target operating frequency. Unfortunately, identifying a single critical path in an integrated circuit is difficult because most integrated circuits have multiple paths that are intended to operate at the same maximum frequency, and manufacturing a separate test path on a die wastes valuable die real estate.

For these and other reasons there is a need for the present invention.

DETAILED DESCRIPTION

Figure 1A:
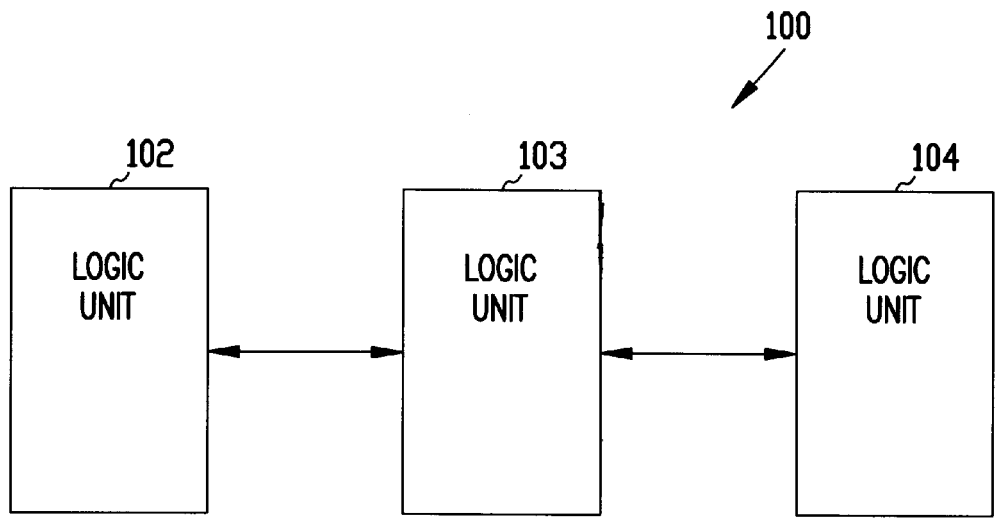
FIG. 1A is a block diagram of some embodiments of a plurality of interconnected logic units according to the teachings of the present invention.

In the following detailed description of the invention, reference is made to the accompanying drawings which form a part hereof, and in which are shown, by way of illustration, specific embodiments of the invention which may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is not to be taken in a limiting sense, and the scope of the present invention is defined only by the appended claims, along with the full scope of equivalents to which such claims are entitled.

FIG. 1A is a block diagram of some embodiments of a plurality of interconnected logic units 100 according to the teachings of the present invention. The plurality of interconnected logic units 100 include logic units 102–104. The logic units 102–104 operate together to perform complex logic functions. In one embodiment, the plurality of interconnected logic units 100 includes a processor. In an alternative embodiment, the plurality of interconnected logic units 100 includes a digital signal processor. In another alternative embodiment, the plurality of interconnected logic units 100 includes a reduced instruction set processor. In still another alternative embodiment, the plurality of interconnected logic units 100 includes a very long instruction word processor.

Figure 1B:
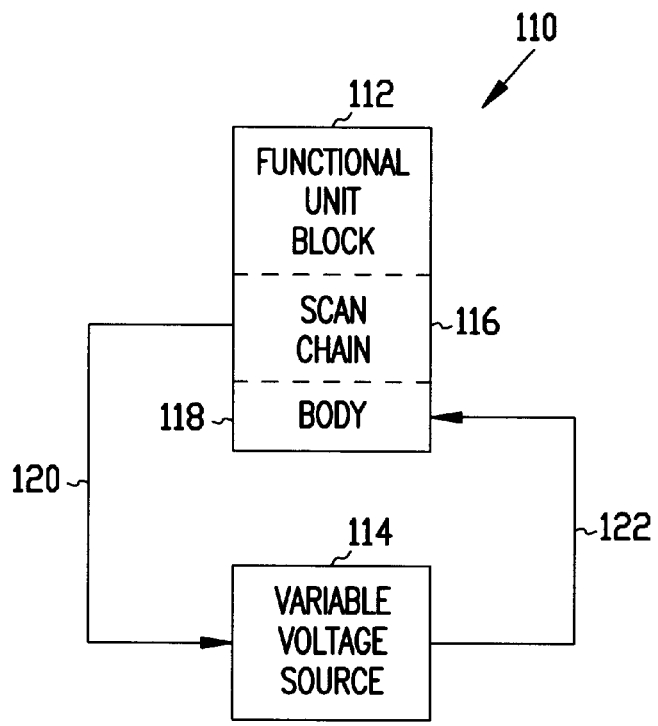
FIG. 1B is a block diagram of some embodiments of one of the plurality of logic units shown in FIG. 1A according to the teachings of the present invention.

FIG. 1B is a block diagram of some embodiments of one of the plurality of interconnected logic units 100 shown in FIG. 1A according to the teachings of the present invention. The logic unit 110 includes a functional unit block 112 and a variable voltage source 114. The functional unit block 112 includes a scan chain 116 and a body 118. The variable voltage source 114 is coupled to the scan chain 116 and to the body 118. In one embodiment, such as in a twin-well process, the body 118 represents the connection to one or more p-type metal-oxide semiconductor field-effect transistor body terminals in the functional unit block 112. In an alternative embodiment, such as in a triple-well process, there are two body connections: one for the p-type metal-oxide semiconductor transistor body terminals and one for the n-type metal-oxide semiconductor transistor body terminals. In some embodiments of the triple-well process, a first voltage source provides a first bias voltage for the p-type metal-oxide semiconductor field-effect transistors, and a second voltage source provides a second bias voltage for the n-type metal-oxide semiconductor field-effect transistors.

The logic unit 110 is formed on a substrate (not shown). The substrate is not limited to being fabricated from a particular material. Any material suitable for use as a substrate in the fabrication of integrated circuits is suitable for use in the fabrication of the substrate on which the logic unit 110 is formed. Exemplary substrate materials include silicon, germanium, gallium arsenide, and silicon carbide.

The functional unit block 112 performs one or more information processing tasks in an electronic system. The functional unit block 112 comprises logic gates and information storage devices, such as flip-flops. Some exemplary electronic systems that utilize functional unit blocks include radar systems, telecommunications systems, wide area networks, local area networks, satellite control systems, automobile brake control systems, and computer systems. Exemplary information processing tasks performed by the functional unit block 112 include target tracking in a radar system, storing and forwarding packets in a packet-switching system, and arithmetic and logic computations in a computer system.

The scan chain 116 includes a plurality of serially connected information storage devices (not shown), however the scan chain 116 is not limited to being formed from a particular type of information storage device. Any information storage devices that are capable of being serially connected are suitable for use in forming the scan chain 116. Exemplary information storage devices capable of being serially connected include flip-flops and memory cells. Exemplary flip-flops include J-K flip-flips and D flip-flops.

The scan chain 116 includes an input device (not shown), which is the first information storage device in the scan chain 116, and an output device (not shown), which is the last information storage device in the scan chain 116. In one embodiment, information is loaded into the scan chain 116 by staging the information at the input port of the input device and delivering a clock signal to each of the plurality of serially connected information storage devices in the scan chain 116. The clock signal causes information to be transferred into the input device and through each of the plurality of serially connected information storage devices in the scan chain 116. Information is read from the scan chain 116 by detecting information at the output device of the scan chain 116 as the clock signal is being delivered to each of the plurality of serially connected information storage devices in the scan chain 116. In an alternative embodiment, information is loaded into the scan chain 116 by writing the information in parallel to each of the plurality of serially connected information storage devices in the scan chain 116, and information is read from the scan chain 116 by reading the information in parallel from each of the plurality of serially connected information storage devices in the scan chain 116.

The body 118 provides a site for applying a bias voltage to the functional unit block 112, which can include p-type metal-oxide semiconductor (PMOS) transistors (not shown), and changing the bias voltage can alter the performance of the functional unit block 112. For example, decreasing the bias voltage applied to the PMOS field-effect transistors increases the speed of the switching elements, such as logic gates and information storage elements formed from the PMOS field-effect transistors, and increasing the bias voltage applied to the PMOS field-effect transistors decreases the speed of the switching elements. Increasing or decreasing the speed of the switching elements in the functional unit block 112 can increase or decrease the speed of the function performed by the functional unit block 112.

The variable voltage source 114 receives the control signal 120 from the scan chain 116, generates the bias voltage 122 from the control signal 120, and provides the bias voltage 122 to the body 118. The control signal 120 includes one or more input control signals. In one embodiment, the control signal 120 includes three input control signals. However, the variable voltage source 114 is not limited to a particular number of input control signals and can be designed to receive any number of input control signals. The variable voltage source 114 generates the bias voltage 122 having an amplitude controlled by the control signal 120. In one embodiment, the variable voltage source 114 is a digital-to-analog converter. The bias voltage 122 preferably has a voltage swing sufficient to move the operating frequency of the scan chain 116 to the target frequency of the logic unit 110. If bias is applied to PMOS field-effect transistors, in some embodiments, the PMOS field-effect transistor bias voltage has a voltage swing of between about 500 millivolts lower than $V_{CC}$ (the supply voltage) and about 500 millivolts higher than $V_{CC}$. If bias is applied to NMOS field-effect transistors (such as in a triple-well process), in some embodiments, the bias voltage has a voltage swing of between about −500 millivolts and about +500 millivolts.

The bias voltage 122 has a preferred value. To determine the preferred value of the bias voltage 122, a test vector is chosen to exercise the worst-case critical path in the functional unit block 112, the test vector is loaded into the scan chain 116, a zero bias voltage is applied by the variable voltage source 114 to the body 118, a clock signal (not shown) having a frequency about equal to the target frequency of the logic unit 112 is applied to the logic unit 110, and a result or output vector is read out of the scan chain 116. The result or output vector is compared to an expected result vector to determine whether the functional unit block 112 is operational. A functional unit block is operational when it operates correctly at its target frequency. If the functional unit block 112 is operational at a zero bias voltage, then the bias voltage is increased incrementally until the functional unit block 112 is not operational. A functional unit block is not operational when it does not operate correctly at its target frequency. The bias voltage which is one voltage increment less than the bias voltage at which the functional unit block 112 fails or is not operational is the preferred bias voltage. If the functional unit block 112 is not operational at a zero bias voltage, then the bias voltage is decreased incrementally until the functional unit block 112 is operational. The bias voltage at which the functional unit block 112 becomes operational is the preferred bias voltage. After identifying the preferred bias voltage for the functional unit block 112, the configuration bits (not shown) for the functional unit block 112 can be permanently programmed by performing an information recording operation, such as burning fuses or writing flash memory bits.

Figure 1C:
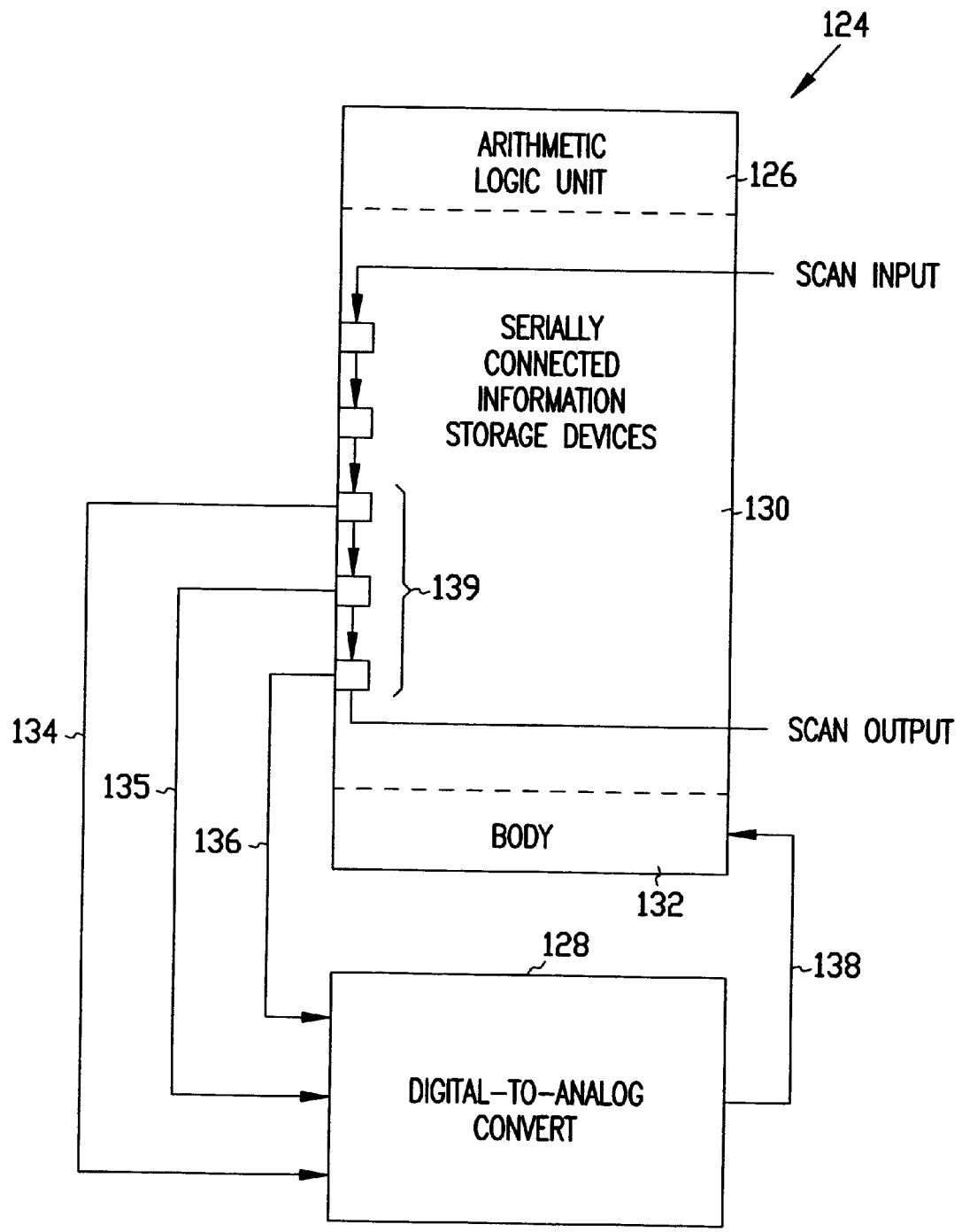
FIG. 1C is a detailed block diagram of some embodiments of one of the plurality of logic units shown in FIG. 1A according to the teachings of the present invention.

FIG. 1C is a detailed block diagram of some embodiments of one of the plurality of logic units shown in FIG. 1A according to the teachings of the present invention. The logic unit 124 includes the arithmetic logic unit 126 and the digital-to-analog converter 128. The arithmetic logic unit 126 includes a plurality of serially connected information storage devices 130 and a body 132.

The arithmetic logic unit 126 includes combinational logic and information storage units arranged to perform arithmetic and logic functions. Exemplary arithmetic functions include addition, subtraction, multiplication, and division. Exemplary logic functions include AND, OR, NAND, NOR and XOR. Arithmetic logic units are commonly used in information processing systems, such as microprocessors, digital signal processors, reduced instruction set processors, complex instruction set processors and very long instruction word processors. The plurality of serially connected information storage devices 130 included in the arithmetic logic unit 126 are serially connected in order to permit serial reading and writing. In the embodiment shown in FIG. 1C, the plurality of serially connected information storage devices 130 includes three information storage devices 139 dedicated to providing control signals to the digital-to-analog converter 128. The plurality of serially connected information storage devices 130 is not limited to a particular type of information storage device. In one embodiment, the plurality of serially connected information storage devices 130 includes J-K flip-flops. In an alternative embodiment, the plurality of serially connected information storage devices 130 includes D flip-flops.

The body 132 in the arithmetic logic unit shown in FIG. 1C functions the same as the body 118 of the logic unit 110 shown in FIG. 1B and described above.

The digital-to-analog converter receives the three control signals 134–136 from the plurality of serially connected information storage devices 130, generates the bias voltage 138, and provides the bias voltage 138 to the body 132. If the body 132 includes PMOS field-effect transistors, in some embodiments, the bias voltage 138 has a voltage swing of between about 500 millivolts lower than $V_{CC}$ (the supply voltage) and about 500 millivolts higher than $V_{CC}$. If the body 132 includes NMOS field-effect transistors (such as in a triple-well process), in some embodiments, the bias voltage 138 has a voltage swing of between about −500 millivolts and about +500 millivolts.

The arithmetic logic unit 126 is fabricated on a die (not shown) and includes a clock input (not shown). After fabrication, the arithmetic logic unit 126 is tested. To test the arithmetic logic unit 126, information is serially read into the plurality of serially connected information storage devices 130 from an input port (not shown). The information defines an initial state for the arithmetic logic unit 126. After the information has been serially read into the plurality of serially connected information storage devices 130, the arithmetic logic unit 126 is clocked for a predetermined number of clock periods. After being clocked, the plurality of serially connected information storage devices 130 is scanned or read at an output port (not shown), and the information scanned or read is compared to a predetermined result vector. If the scanned or read information equals the predetermined result vector, then the arithmetic logic unit 126 is operational. If the scanned out information is not equal to the predetermined result vector, then the arithmetic logic unit 126 is not operational.

Figure 1D:
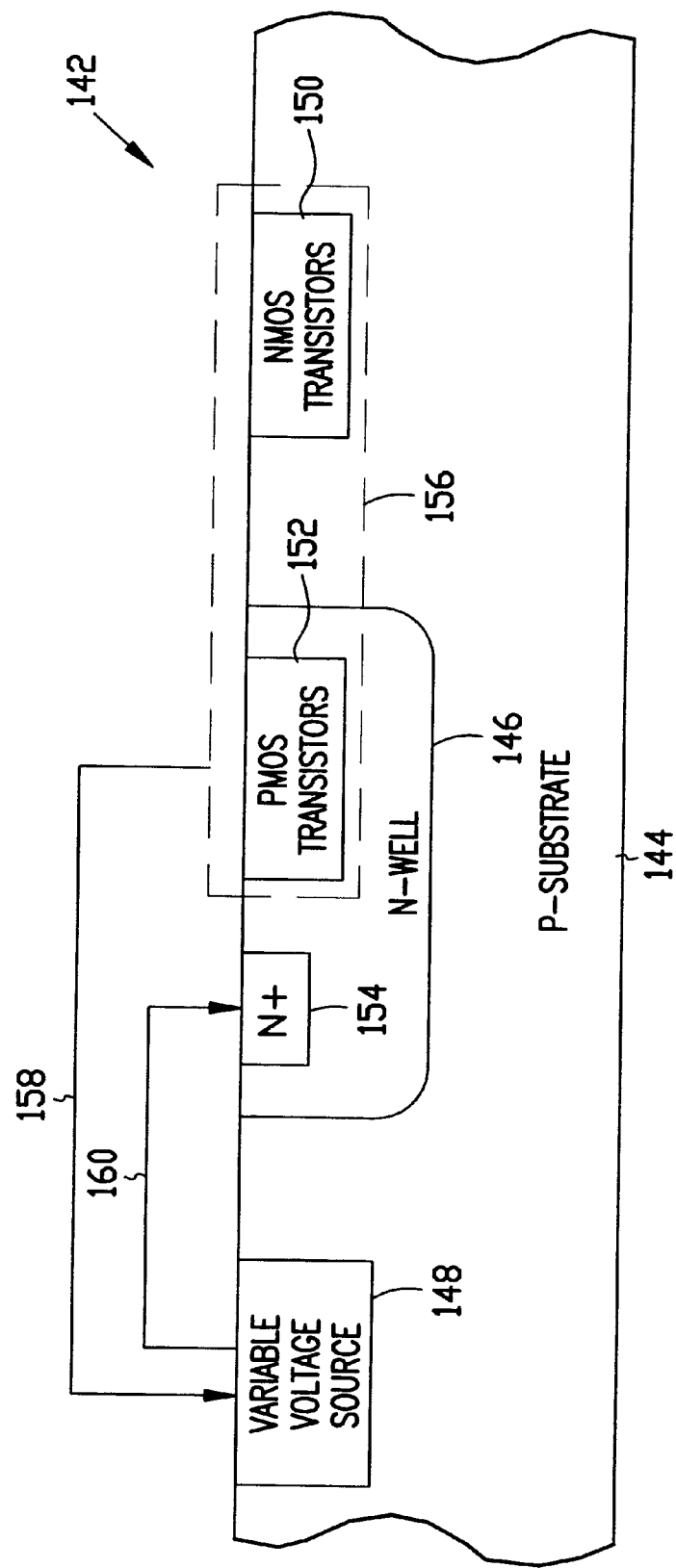
FIG. 1D is an illustration of a cross-sectional view of some embodiments of some of the plurality of logic units shown in FIG. 1A formed on a die according to the teachings of the present invention.

FIG. 1D is an illustration of a cross-sectional view of some embodiments of some of the plurality of logic units 100 shown in FIG. 1A and formed on die 142 according to the teachings of the present invention. The die 142 includes a p-type substrate 144 that includes an n-well 146, a variable voltage source 148, and n-type metal-oxide semiconductor (NMOS) field-effect transistors 150.

The n-well 146 includes p-type metal-oxide semiconductor (PMOS) field-effect transistors 152 and a bias tap 154. A functional unit block 156 includes the NMOS field-effect transistors 150 and the PMOS field-effect transistors 152. The variable voltage source 148 is coupled to the functional unit block 156 and to the bias tap 154. The variable voltage source 148 receives control signals 158 from the functional unit block 156 and provides a bias voltage 160 to the bias tap 154.

Figure 1E:
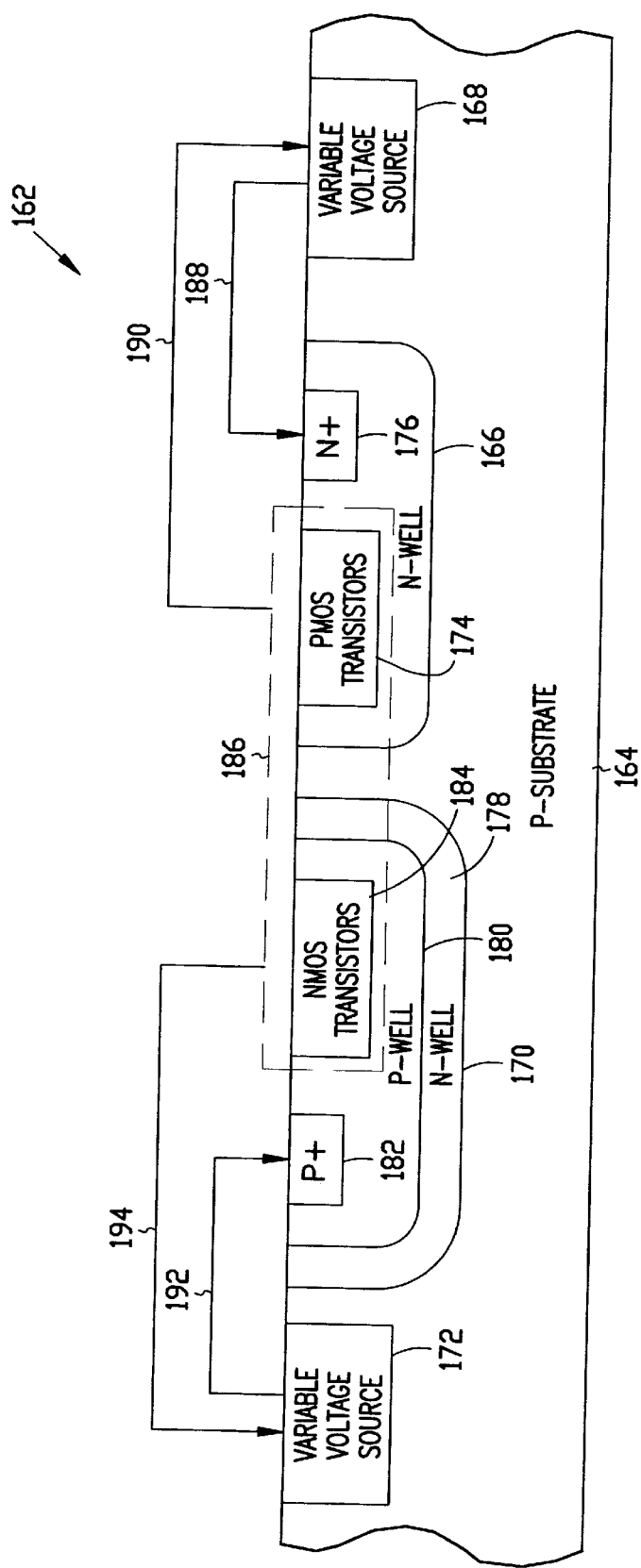
FIG. 1E is an illustration of a cross-sectional view of some alternative embodiments of some of the plurality of logic units shown in FIG. 1A formed on a die according to the teachings of the present invention.

FIG. 1E is an illustration of a cross-sectional view of some alternative embodiments of some of the plurality of logic units 100 shown in FIG. 1A and formed on die 162 according to the teachings of the present invention. The die 162 includes a p-type substrate 164 that includes an n-well 166, a variable voltage source 168, an isolated p-well 170, and a variable voltage source 172.

The n-well 166 includes p-type metal-oxide semiconductor (PMOS) field-effect transistors 174 and a bias tap 176. The p-type metal-oxide semiconductor (PMOS) field-effect transistors 174 and the bias tap 176 are formed in the n-well 166.

The isolated p-well 170 includes an n-well 178, a p-well 180 formed in the n-well 178, and a bias tap 182 formed in the p-well 180 and n-type metal-oxide semiconductor (NMOS) field-effect transistors 184 formed in the p-well 180.

The PMOS field-effect transistors 174 and the NMOS field-effect transistors 184 form a functional unit block 186. The variable voltage source 168 is coupled to the bias tap 176 and the functional unit block 186. The variable voltage source 168 provides a control voltage 188 to the bias tap 176 and receives control signals 190 from the functional unit block 186. The variable voltage source 172 provides a control voltage 192 to the bias tap 182 and receives control signals 194 from the functional unit block 186.

Figure 2:
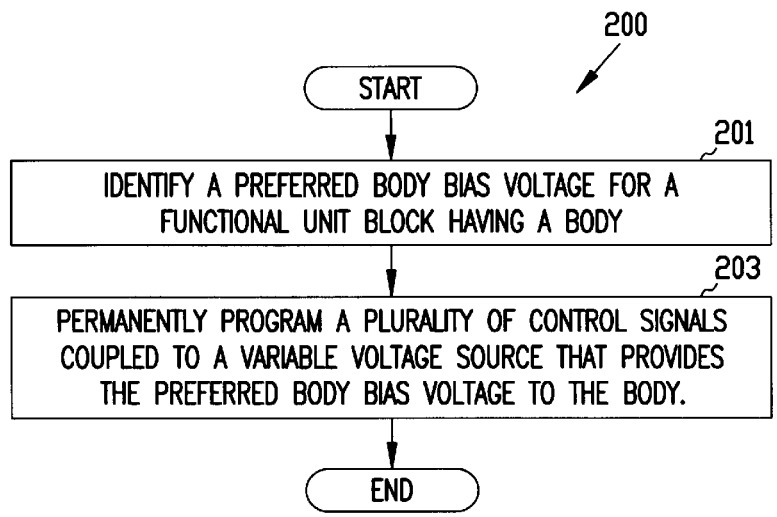
FIG. 2 is a flow diagram of one embodiment of a method for generating a body bias voltage according to the teachings of the present invention.

FIG. 2 is a flow diagram of some embodiments of a method 200 for generating a body bias voltage according to the teachings of the present invention. The method 200 shown in FIG. 2 includes two operations. In one operation shown in block 201, a preferred body bias voltage for a functional unit block having a body is identified. In another operation shown in block 203, a plurality of control signals, which are coupled to a variable voltage source that provides the preferred body bias voltage to the body, is permanently programmed. In an alternative embodiment, identifying a preferred body bias voltage for a functional unit block having a body comprises identifying a body bias voltage for which the functional unit block is operational and for which leakage current in the functional unit block is substantially minimized. In another alternative embodiment, permanently programming a plurality of control signals, which are coupled to a variable voltage source that provides a preferred body bias voltage to the body, includes burning fuses coupled to the variable voltage source. In still another alternative embodiment, permanently programming a plurality of control signals, which are coupled to a variable voltage source that provides the preferred body bias voltage to the body, includes writing flash memory bits coupled to the variable voltage source.

Figure 3:
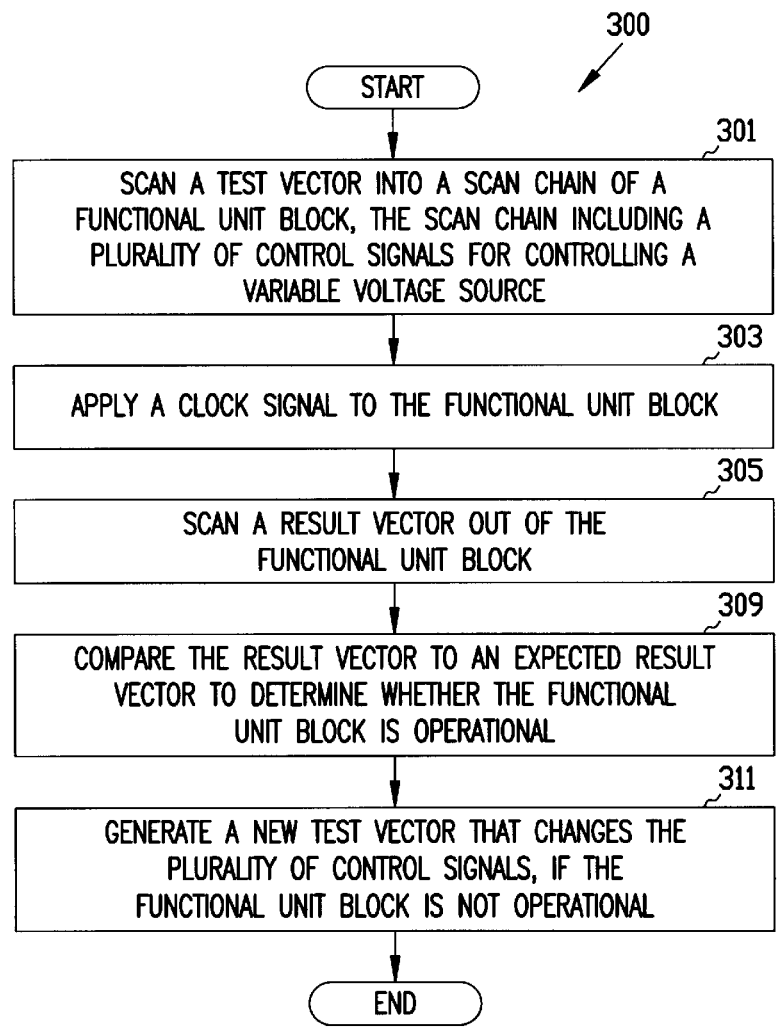
FIG. 3 is a flow diagram of an alternative embodiment of a method for generating a body bias voltage according to the teachings of the present invention.

FIG. 3 is a flow diagram of some alternative embodiments of a method 300 for generating a body bias voltage according to the teachings of the present invention. The method 300 includes scanning a test vector into a scan chain of a functional unit block, the scan chain including a plurality of control signals for controlling a variable voltage source (block 301), applying a clock signal to the functional unit block (block 303), scanning a result vector out of the functional unit block (block 305), comparing the result vector to an expected result vector to determine whether the functional unit block is operational (block 309), and generating a new test vector that changes the plurality of control signals (block 311), if the functional unit block is not operational. In an alternative embodiment, the method 300 further includes adjusting the plurality of control signals to substantially minimize the leakage current in the functional unit block, if the functional unit block is operational. In another alternative embodiment, the method described further includes storing the plurality of control signals, if the functional unit block is operational and the leakage current in the functional unit block is substantially minimized. In another alternative embodiment, the method 300 further includes permanently storing the plurality of control signals, if the functional unit block is operational and the leakage current in the functional unit block is substantially minimized. In still another alternative embodiment, permanently storing the plurality of control signals, if the functional unit block is operational and the leakage current in the functional unit block is substantially minimized, includes burning fuses. In still another alternative embodiment, permanently storing the plurality of control signals, if the functional unit block is operational and the leakage current in the functional unit block is substantially minimized, includes writing flash memory bits.

Figure 4:
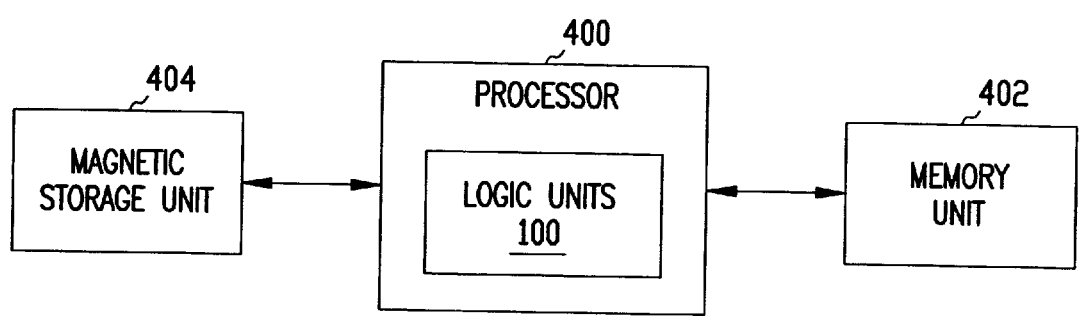
FIG. 4 is a block diagram of some embodiments of a processor connected to a memory unit and a storage unit according to the teachings of the present invention.

FIG. 4 is a block diagram of some embodiments of a processor 400 connected to a memory unit 402 and a storage unit 404 according to the teachings of the present invention.

The processor 400 includes the plurality of interconnected logic units 100. Each of the plurality of interconnected logic units 100 performs one or more logical functions required by the processor 400. The processor 400 is not limited to a particular type of processor. Exemplary processors suitable for use in connection with the present invention include reduced instruction set processors, complex instruction set processors, digital signal processors, and very long instruction word processors.

The memory unit 402 is not limited to a particular type of memory unit. Exemplary memory units include semiconductor memory units and core memory units. Exemplary semiconductor memory units include dynamic random access memory units, static random access memory units, erasable program random access memory units and electrically erasable programmable read-only memory units.

The storage unit 404 is not limited to a particular type of storage unit. In one embodiment, the storage unit 404 is a direct access storage device. In an alternative embodiment, the storage unit 404 is a tape drive. In still another embodiment, the storage unit 404 is a solid state memory. In still another alternative embodiment, the storage unit 404 is a magnetic core storage unit.

Although specific embodiments have been described and illustrated herein, it will be appreciated by those skilled in the art, having the benefit of the present disclosure, that any arrangement which is intended to achieve the same purpose may be substituted for a specific embodiment shown. This application is intended to cover any adaptations or variations of the present invention. Therefore, it is intended that this invention be limited only by the claims and the equivalents thereof.

What is claimed is:

1. A logic unit comprising:
   a functional unit block including a body and a scan chain; and
   a variable voltage source coupled to the scan chain to receive control signals from the scan chain and coupled to the body to provide a bias voltage to the body.

2. The logic unit of claim 1, wherein the functional unit block comprises an arithmetic logic unit.

3. The logic unit of claim 1, wherein the scan chain comprises a plurality of serially connected information storage devices.

4. The logic unit of claim 3, wherein the variable voltage source comprises a digital-to-analog converter.

5. The logic unit of claim 4, wherein the bias voltage comprises a voltage between about 500 millivolts less than $V_{CC}$ and about 500 millivolts more than $V_{CC}$ for the functional unit block including one or more p-type metal-oxide semiconductor field-effect transistors formed in an n-well.

6. The logic unit of claim 4, wherein the digital-to-analog converter receives about three control signal inputs.

7. The logic unit of claim 1, wherein the body comprises an n-well formed in a p-type substrate.

8. The logic unit of claim 1, wherein the body comprises a p-well formed in an n-well formed in a p-type substrate.

9. A logic unit comprising:
   a plurality of interconnected functional unit blocks, each of the plurality of interconnected functional unit blocks having a body, and at least one of the plurality of interconnected functional unit blocks including a scan chain; and
   a variable voltage source coupled to the scan chain to receive control signals from the scan chain and coupled to the body of at least one of the plurality of interconnected functional unit blocks to provide a bias voltage to the body.

10. The logic unit of claim 9, wherein the plurality of interconnected functional unit blocks comprises a processor.

11. The logic unit of claim 10, wherein the processor comprises a digital signal processor.

12. The logic unit of claim 10, wherein each scan chain comprises a plurality of serially connected information storage devices.

13. The logic unit of claim 10, wherein the processor comprises a reduced instruction set processor.

14. The logic unit of claim 13, wherein each variable voltage source comprises a digital-to-analog converter.

15. The logic unit of claim 10, further comprising a memory unit connected to the processor.

16. The logic unit of claim 15, further comprising a magnetic storage unit connected to the processor.

17. A method comprising:
    identifying a preferred body bias voltage for a functional unit block having a body; and
    permanently programming a plurality of control signals coupled to a variable voltage source that provides the preferred body bias voltage to the body.

18. The method of claim 17, wherein identifying a preferred body bias voltage for a functional unit block having a body comprises:
    identifying a body bias voltage for which the functional unit block is operational and for which leakage current in the functional unit block is substantially minimized.

19. The method of claim 18, wherein permanently programming a plurality of control signals coupled to a variable voltage source that provides the preferred body bias voltage to the body comprises:

burning fuses coupled to the variable voltage source.

20. The method of claim 18, wherein permanently programming a plurality of control signals coupled to a variable voltage source that provides the preferred body bias voltage to the body comprises:

writing flash memory bits coupled to the variable voltage source.

21. A method comprising:

scanning a test vector into a scan chain of a functional unit block, the scan chain including a plurality of control signals for controlling a variable voltage source;

applying a clock signal to the functional unit block;

scanning a result vector out of the functional unit block;

comparing the result vector to an expected result vector to determine whether the functional unit block is operational; and generating a new test vector that changes the plurality of control signals, if the functional unit block is not operational.

22. The method of claim 21, further comprising adjusting the plurality of control signals to substantially minimize the leakage current in the functional unit block, if the functional unit block is operational.

23. The method of claim 22, further comprising:

storing the plurality of control signals, if the functional unit block is operational and the leakage current in the functional unit block is substantially minimized.

24. The method of claim 21, further comprising:

permanently storing the plurality of control signals, if the functional unit block is operational and the leakage current in the functional unit block is substantially minimized.

25. The method of claim 24, wherein permanently storing the plurality of control signal, if the functional unit block is operational and the leakage current in the functional unit block is substantially minimized, comprises:

burning fuses.

26. The method of claim 24, wherein permanently storing the plurality of control signals, if the functional unit block is operational and the leakage current in the functional unit block is substantially minimized, comprises:

writing flash memory bits.

* * * * *